United States Patent

Bertram

[11] Patent Number: 5,949,290
[45] Date of Patent: Sep. 7, 1999

[54] VOLTAGE CONTROLLED OSCILLATOR TUNING APPARATUS AND METHOD

[76] Inventor: Earnest L. Bertram, 11854 Page Mill Rd., Los Altos Hills, Calif. 94022

[21] Appl. No.: 08/933,567

[22] Filed: Sep. 19, 1997

Related U.S. Application Data

[60] Provisional application No. 60/035,471, Jan. 14, 1997.

[51] Int. Cl.$^6$ ................ H03L 7/00; H03L 7/06
[52] U.S. Cl. .............. 331/9; 331/175; 331/1 R; 331/10; 331/32; 331/16; 327/105
[58] Field of Search .................. 331/9, 11, 175, 331/177 V, 32, 1 R, 10, 16; 327/105, 107

[56] References Cited

U.S. PATENT DOCUMENTS 3,614,649  10/1971  Gerig ........................... 331/17

*Primary Examiner*—Arnold Kinkead
*Attorney, Agent, or Firm*—Jeffrey P. Aiello; Carol D. Titus; James J. Leary

[57] ABSTRACT

A 1-port tunable frequency discriminator that is incorporated into a frequency lock loop (FLL) for providing an improved FLL having reduced phase noise and settling times is provided. The invented 1-port tunable delay line discriminator reduces the phase noise generated by VCO's to approximately 105 dBc/Hz at 10 kHz, to better than 120 dBc/Hz at 100 kHz. The invention additionally reduces post tuning drift to less than 10 kHz after one microsecond. A secondary feedback loop, such as a conventional phase lock loop, can be incorporated into the invented FLL for providing phase and frequency coherency. The invention is formed by coupling a voltage controlled oscillator source (VCO) to a microwave signal detector and to an open ended delay line. When a microwave signal generated by the VCO reaches an end of the open ended delay line, a majority of the signal is reflected back along the line. When the reflected signal reaches a beginning of the delay line a standing wave (SW) signal is created were the microwave signal entering the delay line interferes with the reflected signal returning from the open end of the delay line. As the frequency of the VCO is tuned, the phase of the SW changes. A variable capacitance can be added to the open end of the delay line for adjusting the phase of the delay line signal, causing the SW to tune in delay time.

16 Claims, 2 Drawing Sheets

FLL ASSEMBLY

PLL/FLL ASSEMBLY

VOLTAGE CONTROLLED OSCILLATOR TUNING APPARATUS AND METHOD

This application claims the benefit of U.S. Provisional Patent Application Ser. No. 60/035,471, filed on Jan. 14, 1997.

BACKGROUND OF THE INVENTION

1. Field of the Invention

The present invention relates generally to phase and frequency locked signal sources, and more particularly, to an improved frequency lock loop (FLL) incorporating a 1-port tunable frequency discriminator for reducing phase noise and settling times over prior art frequency locked loop circuits.

2. Description of Related Art

Signal sources for generating frequency coherent signals are useful in a number of applications, including use as a precise radio frequency reference signal source. Particularly useful for such frequency generation are electronic circuits known in the art as voltage controlled oscillators (VCOs). However, disadvantageous characteristics common to tunable signal sources, including VCOs, is that there is the presence of non-frequency coherent signal sidebands, commonly referred to as phase noise (PN). Another disadvantageous characteristic is that there is continued frequency drift after initially tuning the VCO to a desired frequency, known as post tuning drift (PTD).

High performance low phase noise signal sources in use today typically produce PN values of 75 dBc/Hz at 10 kHz and 104 dBc/Hz and 100 kHz from the VCO carrier frequency, and PTD values on the order of 4 MHz to 7 MHz, in a 1 microsecond time frame. To improve upon these performance characteristics, various frequency lock loops (FLLs), phase lock loops (PLLs), multiple loop PLLs (MLPLLs), direct synthesis synthesizers (DSS), and combinations of these circuits have been used to reduce unwanted PN and PTD. Unfortunately, there remain problems with performance, cost, and physical size, among others, when using these circuits.

PLL frequency synthesizers are the most common of the frequency lock loop circuits and have been utilized with VCO's for many years to provide a stable output signal having a precise and predictable frequency. The use and limitations of PLLs are well known in the art. Of particular concern with PLLs has been the problem of small frequency step size requirements, due to practical chip noise limitations and PN degradation. The PN degradation is 20* log (N), where N is the total divisor required to tune a VCO to a specific frequency. It follows that single loop synthesizers that have very small step size requirements particularly suffer in their PN performance, due to the necessarily large values of N.

Common prior art efforts to solve this problem have been to use DSS or MLPLL circuitry. However, both of these circuits are substantially expensive and require a significant amount of physical volume. Further, both of these techniques tend to generate unwanted spurious signal products. Another prior art technique for solving this problem is the utilization of an FLL in conjunction with a PLL. In this combination, the FLL accomplishes noise reductions, while the PLL accomplishes the phase lock and reference signal tracking. Typically, such FLLs use a 2-port delay line discriminator and a complex broadband voltage tunable delay line. Unfortunately, these circuits are also complex, costly, and substantially large in physical size.

Thus, there exists a need for an improved frequency lock loop (FLL) incorporating a 1-port tunable frequency discriminator for reducing phase noise and settling times over prior art frequency lock loop circuits.

OBJECTS OF THE INVENTION

It is therefore an object of the present invention to provide a 1-port tunable frequency discriminator that provides substantially reduced phase noise values and settling times;

It is another object of the present invention to provide a 1-port tunable frequency discriminator that is incorporated into a frequency lock loop (FLL) for providing an improved FLL for reducing phase noise and settling times over prior art frequency lock loops;

It is a further object of the present invention to provide an improved FLL incorporating a 1-port tunable frequency discriminator that provides phase noise values substantially reduced over the phase noise values provided by prior art FLL and phase lock loop (PLL) systems, direct synthesis synthesizers (DSS), and multiple loop PLL (MLPLL) circuits;

It is still another object of the present invention to provide an improved FLL incorporating a 1-port tunable frequency discriminator that reduces the phase noise generated to known VCO's to approximately 105 dBc/Hz at 10 kHz;

It is yet a further object of the present invention to provide an improved FLL incorporating a 1-port tunable frequency discriminator that substantially reduces post tuning drift (PTD);

It is another object of the present invention to provide an improved FLL incorporating a 1-port tunable frequency discriminator that is relatively small in physical size and does not comprise substantially complex circuitry; and It is a still further object of the present invention to provide an improved FLL incorporating a 1-port tunable frequency discriminator that is not substantially costly.

SUMMARY OF THE INVENTION

These and other objects and advantages of the present invention are achieved by providing a 1-port tunable frequency discriminator that is incorporated into a frequency lock loop (FLL), for providing an improved FLL for reducing phase noise and settling times over prior art frequency lock loops. The present invention includes a novel 1-port tunable frequency discriminator that includes a radio frequency (RF) detector assembly, a low loss delay line assembly, and a variable capacitance tuning element assembly. These circuitry assemblies are configured with known FLL elements to form an improved FLL that provides low phase noise (PN) and fast set on times to reduce post tuning drift (PTD). The 1-port tunable delay line discriminator of the present invention reduces the phase noise generated by known VCO's to approximately 105 dBc/Hz at 10 kHz, to better than 120 dBc/Hz at 100 kHz. The invention further reduces post tuning drift to less than 10 kHz after one microsecond.

A secondary feedback loop, such as a conventional phase lock loop (PLL), can be incorporated into the improved FLL of the present invention for providing phase and frequency coherency thereof.

Particularly, the present invention comprises a 1-port tunable delay line acting as a frequency discriminator. The 1-port tunable delay line frequency discriminator is formed by first coupling a voltage controlled oscillator source (VCO) to a microwave signal detector, then to an open ended delay line. When an incident microwave signal generated by the VCO reaches an end of the open ended delay line, a majority of the signal is reflected back along the delay line. When the reflected signal reaches a beginning of the delay line a standing wave (SW) signal is created were the incident microwave signal entering the delay line interferes with the reflected signal returning from the open end of the delay line. As the frequency of the VCO is tuned, the phase of the SW changes.

A detector detects the SW signal and utilizes the SW signal, in conjunction with the FLL and PLL, to tune the VCO to a nearly exact frequency. Since the SW signal contains all unwanted spectral sideband noise energy, thus reducing the unwanted noise energy relative to the desired spectral signal component, the PN of the VCO is reduced.

Additionally, the 1-port tunable frequency discriminator of the present invention can be modified to enable the phase of the delay line signal to be adjusted, for causing the SW signal to tune in delay time. This feature is obtained by the addition of a variable capacitance, such as a tuning varactor diode (TVD), to the open end of the delay line. The TVD is adjustable for adjusting the phase of the delay line signal, causing the SW signal to tune in delay time.

With the addition of a conventional loop amplifier, filter, and VCO, an improved FLL is formed. The improved FLL has fewer components than prior art 2-port line discriminators and generates signals having substantially lower RF noise levels than prior art circuits. Therefore, the incorporation of the TVD into the 1-port tunable frequency discriminator of the present invention allows the 1-port tunable frequency discriminator to be tuned in frequency, and by varying the capacitance of the TVD, to tune the VCO. In applications wherein the VCO does not have to be tuned to an exact frequency, but when it is desired to reduce phase noise (PN) and post turning drift (PTD) of the VCO, the invented 1-port tunable delay line frequency discriminator circuit can be used as a stand alone FLL that generates signals having a low PN and reduced PTD. Where phase coherency is required, a PLL can be added to the FLL and a phase detector error signal generated by the PLL can be summed with a signal controlled by the TVD, or the loop filter, or both.

BRIEF DESCRIPTION OF THE DRAWINGS

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings, in which:

DESCRIPTION OF THE PREFERRED EMBODIMENTS

The following description is provided to enable any person skilled in the art to make and use the invention and sets forth the best modes presently contemplated by the inventor of carrying out the invention. Various modifications, however, will remain readily apparent to those skilled in the art, since the generic principles of the present invention have been defined herein.

Figure 1:
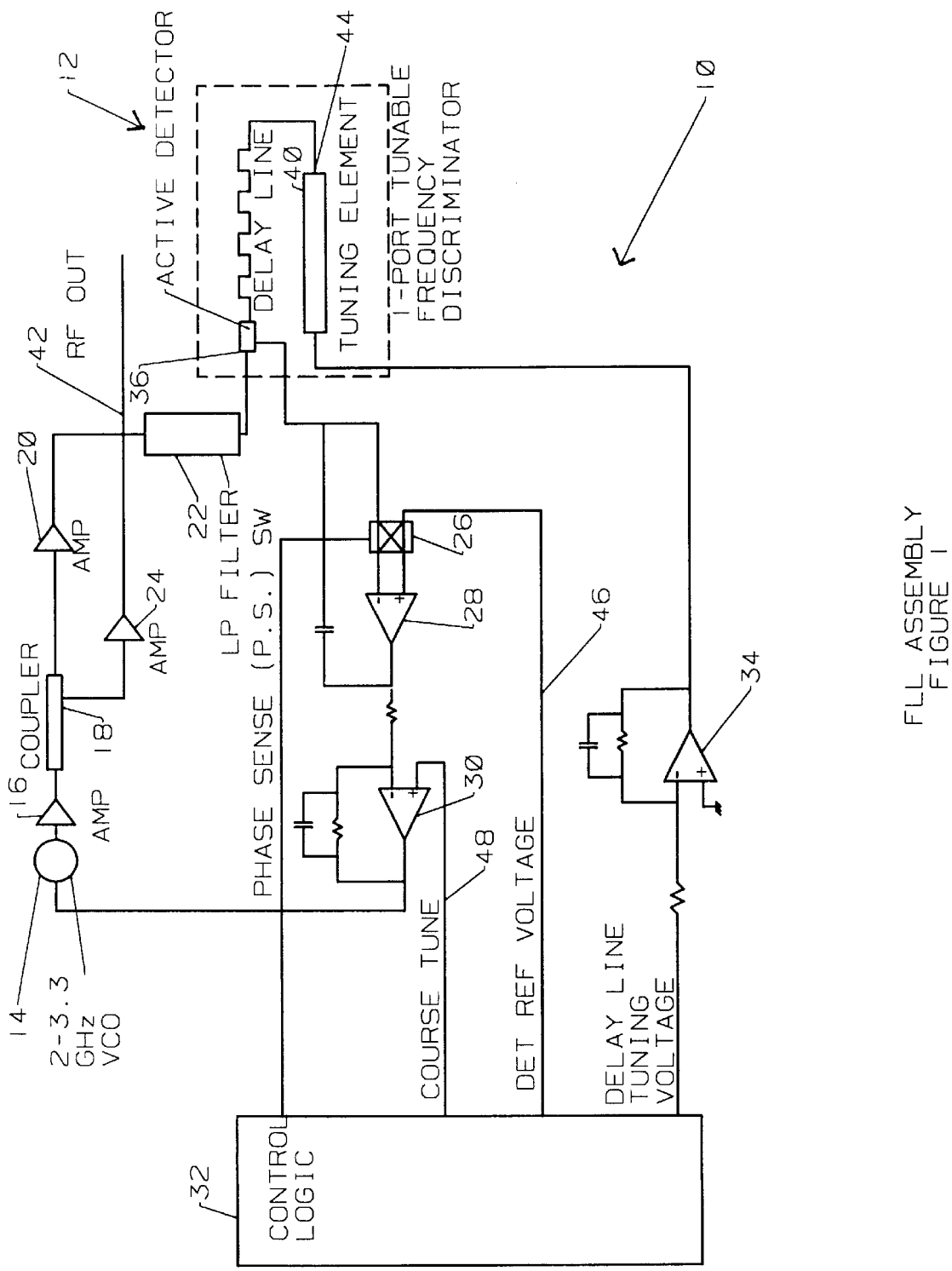
FIG. 1 is a circuit block diagram showing a novel frequency lock loop (FLL) that incorporates a preferred embodiment of a 1-port tunable frequency discriminator of the present invention.
Figure 2:
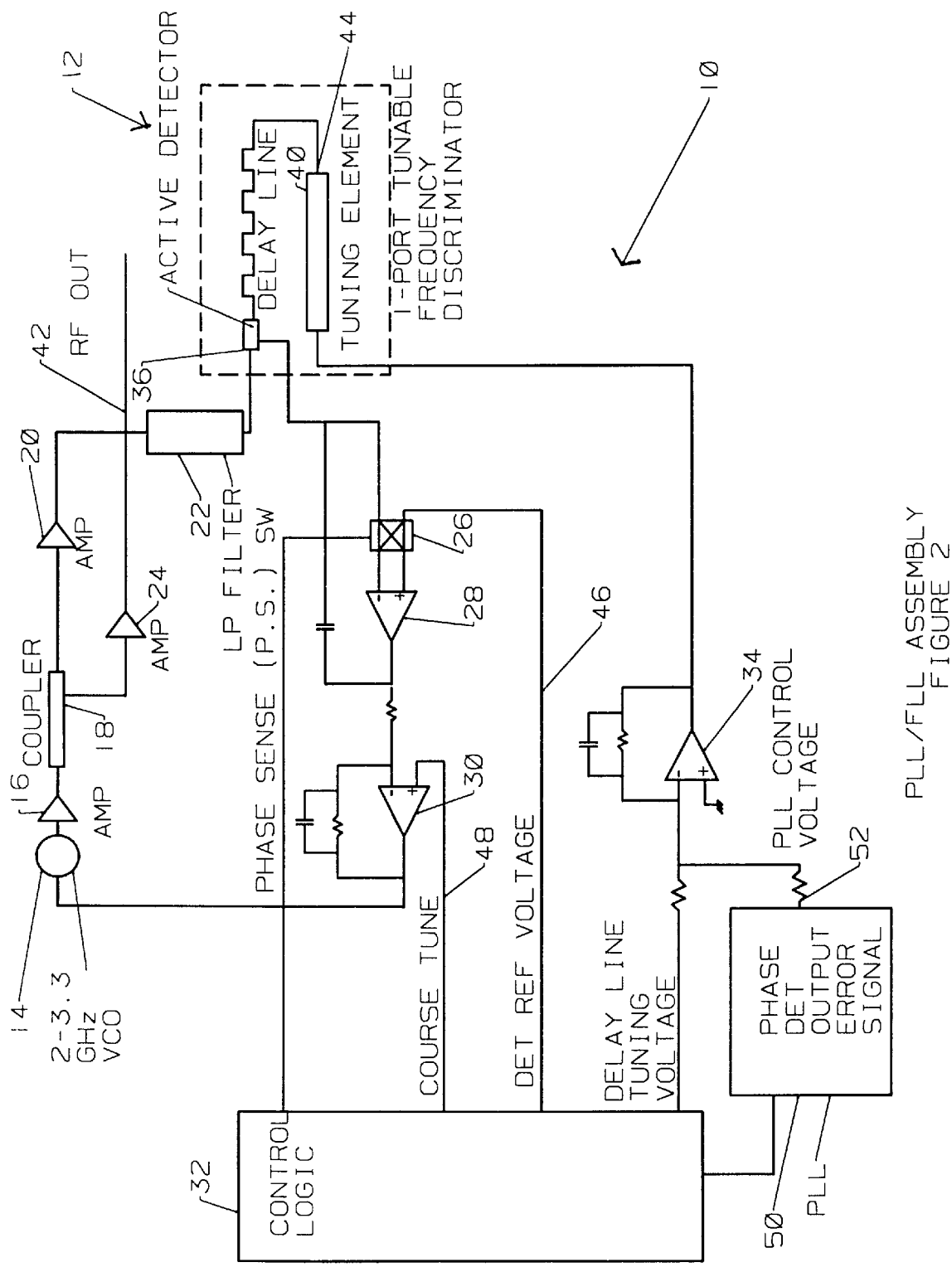
FIG. 2 is a circuit block diagram showing a frequency synthesizer using the improved FLL that incorporates the preferred embodiment of a 1-port tunable frequency discriminator of the present invention and further incorporating conventional phase lock loop (PLL) circuitry.

Referring now to the drawing Figures, and particularly to FIG. 1, there is shown generally at 10, a preferred embodiment of an improved frequency lock loop (FLL) that incorporates a preferred embodiment of a 1-port tunable frequency discriminator circuit, shown generally at 12, of the present invention. With the incorporation of the invented 1-port tunable frequency discriminator circuit 12, the improved FLL 10 of the present invention provides lower VCO phase noise (PN) levels than the PN levels achievable by direct synthesis synthesizer (DSS) and multiple loop PLL (MLPLL) devices. Additionally, the present invention 10 provides sub-microsecond frequency set on times, thus reducing, and potentially eliminating, post tuning drift (PTD) after a 1 microsecond time period. The FLL 10 of the present invention can be combined with a conventional phase lock loop (PLL), as shown in FIG. 2, for achieving frequency and phase coherency, in addition to the low PN levels generated by the invention 10 and sub-microsecond frequency set on times provided thereby.

The improved FLL 10 of the present invention includes a voltage controlled oscillator (VCO) 14, an initial buffer amplifier 16, a coupler 18, a final buffer amplifier 20, a low pass filter 22, the preferred embodiment of the invented 1-port tunable frequency discriminator circuit 12, an output amplifier 24, a phase sense (PS) switch 26, a loop integrator 28, a loop summing amplifier 30, a control logic integrated circuit device 32, and a delay line adjustment amplifier 34. The 1-port frequency discriminator circuit 12 (to be thoroughly discussed hereinafter) includes an active detector 36, a delay line 38, and preferably a tuning varactor diode (TVD) 40. In the preferred embodiment, the VCO 14 comprises a commercially available low noise silicon transistor type device that includes a hyper-abrupt varactor diode (not shown) as its frequency tuning element. The inherent nature of the hyper-abrupt varactor diode of the VCO 14 reduces to a minimum the modulation sensitivity change of the VCO 14, as the VCO 14 is tuned over its bandwidth. The hyper-abrupt diode of the VCO 14 also reduces the effort necessary to gain compensate the FLL 10, as the VCO 14 is tuned over its bandwidth.

The VCO 14 transmits an output signal to the initial buffer amplifier 16 that provides load isolation for the VCO 14. The coupler 18 receives the amplified output signal from the initial buffer amplifier 16 and splits the signal into two components. A first component of the signal is transmitted to the final buffer amplifier 20, via the low pass filter 22, for driving the detector 36 and tunable delay line 38 of the 1-port frequency discriminator circuit 12.

A second component of the split signal is directed to the output amplifier 24. The output amplifier 24 is coupled to an output line 42, that provides a usable output signal source of the FLL 10. The output line 42 may be coupled to external circuitry so that the output signal generated by the FLL 10 may be utilized by external circuitry and external users. The output amplifier 24 amplifies the output signal of the FLL 10 along with performing desired signal processing on the second component of the split signal for tailoring the output signal for different selected applications.

The final buffer amplifier 20, is configured as a balanced amplifier to insure a good match to the low pass filter 22 and invented 1-port frequency discriminator circuit 12. This match is desirable for reducing triple transit reflections to a minimum, to prevent the creation of a third interference signal at the detector 36 of the 1-port frequency discriminator circuit 12 which could distort the standing wave (SW) signal produced in the delay line 3 8 and introduce a loop gain error. Further, the final buffer amplifier 20 is intentionally driven into hard saturation, to reduce possible amplitude modulation (AM) noise generated by the VCO 14 and the initial buffer amplifier 16.

The low pass filter 22 reduces harmonics in the radio frequency (RF) noise of the split signal transmitted by the final buffer amplifier 20 before it is passed into the 1-port frequency discriminator circuit 12. Since proper operation of the invented 1-port frequency discriminator circuit 12 relies upon the use of a standing wave (SW) signal produced by an incident signal generated by the VCO 14 and a reflected signal, reflected back along the delay line 38 from an open end 44 thereof, any other unwanted signal energy present may cause distortion in the SW signal. Because cancellation nulls as deep as 10–15 dB below the input carrier signal are typical when the incident signal and the reflected signal in the delay line 38 are at maximum cancellation, and harmonics of the incident signal in the delay line 38 also create SW signals with the reflected signal, it follows that distortion of the desired SW signal can occur if the harmonic energy is too high. However, during use of the present invention, it has been found empirically that distortion of the desired SW signal can be kept well within acceptable limits if the harmonic energy is kept at least 40 dB below the incident signal generated by the VCO 14. Therefore, the low pass filter 22 is used to reduce harmonics in the radio frequency (RF) noise of the split signal.

Referring still to FIG. 1 of the drawings, the 1-port frequency discriminator circuit 12 of the present invention is the key point of novelty over prior art frequency lock loop circuits. Prior art frequency lock loop circuits are not provided with circuitry equivalent to the circuitry of the FLL 10 of the present invention, and have relied upon 2-port designs which are implemented quite differently, and are substantially costly and large in physical dimensions.

The delay line 38 receives the amplified output signal from the final buffer amplifier 20, via the low pass filter 22 and detector 36. The delay line 38 preferably comprises a low loss open ended delay line, so that the incident RF energy directed into the delay line 38, less any loss, is reflected back along the line 38 toward the detector 36. The reflected signal is reflected back along the delay line 38 from the open end 44 thereof, so that the reflected signal interferes with the incident RF energy at the detector 36 to form the standing wave (SW) signal. Thus, the reflected RF energy interfering with the incident radio frequency (RF) energy creates the standing wave (SW) signal on the delay line 38. The frequency sensitivity of the 1-port frequency discriminator circuit 12 is inversely proportional to the length of the delay line 38, with increased length accordingly producing greater frequency sensitivity. In the preferred embodiment, the delay line 38 comprises a coaxial type line. However, any known low energy loss type line element can be used in the invented FLL 10.

The phase of the SW signal produced in the delay line 38 is determined by both the frequency of the VCO 14 and the value of the capacitance of the tuning varactor diode (TVD) 40. It should be noted that while the TVD 40 preferably comprises a hyper abrupt varactor diode, other devices which can change in capacitance as a function of either voltage, current, or light energy may be substituted. Variable capacitance is needed because the phase of the SW signal produced in the delay line 38 is determined by both the frequency of the VCO 14 and by the value of the capacitance of the TVD 40. By selectively controlling the value of capacitance of the TVD 40, the phase of the SW at a given VCO 14 output frequency may be selectively varied. In theory, the phase in the SW signal can be tuned across 180 degrees as the capacitance of the TVD 40 is varied from zero to infinity. However, in practice it is the inventor's experience that this phase can be varied over no more that 140 degrees, due to limitations of the TVD 40 in total capacitance swing. It should be noted that capacitance as a function of either voltage, current, or light energy can be used equally as well.

After the detector 36 receives the SW signal, the detector 36 converts the RF energy of the SW signal to an output signal having a frequency corresponding to the frequency to which the VCO 14 is tuned and a voltage level proportional to the magnitude of the RF energy. The nominal voltage of the output signal is essentially a sinusoidal waveform varying in magnitude from–0.2 to 1.4 volts at its maximum. Higher incident RF signal levels into the 1-port frequency discriminator circuit 12 will increase the magnitude of this voltage. All frequency modulation (FM) spectral components of the VCO 14 from direct current (DC) to the detection bandwidth of the detector 36 are represented in this signal. The detector 36 is designed to have a detection bandwidth of greater than 25 MHz to insure that it will have negligible influence on overall loop bandwidth of the complete FLL 10.

The loop integrator 28 receives the output signal from the detector 36 and compares the output signal to an externally supplied reference voltage 46 referred to as the detector reference voltage. The detector reference voltage 46, which may be generated by the control logic device 32, is nominally equal in magnitude to the midpoint between the minima and maxima of the output signal. However, as noted above, the practical limits on the TVD 40 limit the total tuning range of the SW signal to approximately 140 degrees. To cover the complete 360 degrees of frequency coverage required to have continuous coverage of the FLL 10, two additional loop control elements are added.

Firstly, to complete the required 360 degrees of frequency coverage of the FLL 10, the detector reference voltage 46 is adjusted about its midpoint, using the logic device 32, to cover the portions of the SW signal that cannot be obtained by the TVD 40. Secondly, to obtain the remaining 180 degrees of required frequency coverage, an analog transfer switch, which comprises the phase sense (PS) switch 26, is interposed between the loop integrator 28 and TVD 40. The switch 26 switches the phase sense of the FLL 10 180 degrees, for obtaining the remainder of the required 360 degrees of frequency coverage. Once the phase sense is switched, the detector tuning voltage 46 and signal transmitted from the TVD 40 can be used to tune the VCO 14 over the remaining 180 to 360 degrees required tuning range. The loop summing amplifier 30 sums the output of the loop integrator 28, which is the FLL error signal, and an externally applied course tuning voltage 48, which may be generated by the control logic device 32, and produces the signal used to tune the VCO 14 and thus complete the electronic loop of the preferred embodiment of the improved FLL 10 of the present invention.

The FLL dynamics of the preferred embodiment of the invented the 1-port tunable frequency discriminator circuit 12 has a loop bandwidth of approximately 7 MHz. Due to the relatively wide loop bandwidth, the PN of the VCO 14 is reduced by approximately 30 dB at 10 kHz and 20 dB at 100 kHz from the carrier frequency. For example, at 10 kHz off the carrier frequency, the VCO 14 PN is reduced from 75 dBc/10 kHz to 105 dBc/100 kHz, which is a substantial improvement over prior art frequency locked loop circuits. Because the frequency of the loops is determined by the FLL 10, and more specifically, the capacitance of the TVD 40, the post tuning drift (PTD) of the VCO 14 is substantially reduced. In the preferred embodiment 10, the PTD was reduced from 5 MHz, to less than 10 kHz over the time period of approximately 1 microsecond to 30 seconds.

The control logic device 32 may comprise any suitable commercially available integrated circuit device known in the art. The device 32 preferably provides such functions as selection of the voltages including selecting the correct course tuning voltage 48, detector reference voltage 46, TVD tuning voltage, and phase transfer switch 26.

Referring particularly now to FIG. 2 of the drawings, there is shown generally at 50, a phase locked loop (PLL) circuit that is coupled to the FLL 10 of the preferred embodiment of the present invention. The PLL 50 may comprise any conventional and commercially available PLL and having a configuration appropriate for coupling the circuit 50 to the invented FLL 10. The PLL 50 is coupled to the delay line adjustment amplifier 34 and the control logic device 32. The is PLL 50 has an output 52 coupled to the TVD 40, via the delay line adjustment amplifier 34, so that the PLL's output signal is applied to the 1-port discriminator circuit 12. The output signal of the PLL 50 is summed with the TVD tuning voltage to directly fine tune control of the FLL 10, and to fine tune control of the FLL 10 without loop gain and loop bandwidth conflicts common to prior art FLL and PLL integrated systems. Additionally, the PLL 50 enables the invented FLL 10 to achieve frequency and phase coherency, in addition to the low PN levels generated by the invention 10 and sub-microsecond frequency set on times provided thereby.

The delay line amplifier 34 is provided for establishing an initial offset voltage for the TVD 40. The off set voltage is used to initialize the tuning range of the TVD 40 and to provide an interface for the PLL 50, when the PLL 50 is utilized.

Those skilled in the art will appreciate that various adaptations and modifications of the just-described preferred embodiments can be configured without departing from the scope and spirit of the invention. Therefore, it is to be understood that, within the scope of the appended claims, the invention may be practiced other than as specifically described herein.

What is claimed is:

1. A one-port tunable frequency discriminator circuit for use with a frequency lock loop circuit for providing an improved frequency lock loop circuit having reduced phase noise and settling times, the frequency lock loop circuit including a voltage controlled oscillator source for generating signals at different selected frequencies, signal splitting means coupled to the oscillator source, an output amplifier coupled to an output of the signal splitting means for providing an output signal source of the frequency locked loop, a loop integrating amplifier coupled to the signal splitting means and to the oscillator source, and control logic means coupled to the oscillator source for controlling tuning of the oscillator source, thereby controlling tuning of the frequency lock loop, the one-port tunable frequency discriminator circuit comprising:

a signal detector means coupled to the signal splitting means and to the oscillator source via the integrating amplifier; and an open ended delay line coupled to the signal detector means;

wherein, a signal generated by the oscillator source is sensed by the signal splitting means and split thereby into a first signal for transmission to the signal detector means and a second signal for transmission to the output amplifier, the signal detector means detecting the first signal and transmitting the first signal along the delay line, upon reaching an end of the delay line, the first signal is reflected back along the line to the signal detector means creating a reflected first signal such that the reflected first signal interferes with the first signal to form a standing wave signal, the standing wave signal providing information including undesired spectral sideband noise energy, the signal detector means converting the standing wave signal to a frequency locking signal having a voltage level proportional to the magnitude of the standing wave signal and transmitting the frequency locking signal to the oscillator source for locking the oscillator source at a specific frequency, wherein as the oscillator source is frequency tuned, the signal detector means detects the phase of the standing wave signal and reduces phase noise in signals generated by the frequency lock loop circuit.

2. The one-port tunable frequency discriminator circuit of claim 1 further comprising:

phase adjusting means for adjusting the phase of the standing wave signal at a specific frequency generated by the frequency lock loop circuit for further reducing phase noise in signals generated by the frequency lock loop, the phase adjusting means enabling the first signal generated by the signal detector means to be tuned in frequency for enabling tuning of the oscillator source by the one-port tunable frequency discriminator circuit.

3. The one-port tunable frequency discriminator circuit of claim 2 further comprising:

means for enabling the phase adjusting means to adjust the phase of the standing wave signal 360 degrees at the specific frequency generated by the frequency lock loop, the augmenting means providing a complete 360 degrees of frequency tuning range required by the frequency lock loop circuit.

4. The one-port tunable frequency discriminator circuit of claim 3 wherein the means comprises:

the control logic means transmitting a reference voltage to the loop integrating amplifier, the reference voltage adjusted about a midpoint thereof by the control logic means for increasing the phase adjusting range of the phase adjusting means; and phase sense switch means interposed between the control logic means and integrating amplifier for receiving the reference voltage transmitted by the control logic means, the phase sense switch means actuated for shifting the phase sense of signals output by the integrating amplifier to obtain a remaining portion of the complete 360 degrees of frequency tuning range required by the frequency lock loop.

5. The one-port tunable frequency discriminator circuit of claim 4 wherein adjusting the reference voltage with the control logic means about the midpoint of the reference voltage provides approximately 40 degrees of phase shift for increasing the phase range of the phase adjusting means to approximately 180 degrees.

6. The one-port tunable frequency discriminator circuit of claim 4 wherein the phase sense switch means shifts the phase sense of signals output by the integrating amplifier approximately 180 degrees to obtain a remaining portion of the complete 360 degrees of frequency tuning range required by the frequency lock loop.

7. The one-port tunable frequency discriminator circuit of claim 4 further comprising:
   a phase lock loop circuit coupled to the frequency lock circuit for providing phase and frequency coherency of output signals generated thereby.

8. A one-port tunable frequency discriminator circuit for use with a frequency lock loop circuit for providing an improved frequency lock loop circuit having reduced phase noise and settling times, the one-port tunable frequency discriminator circuit comprising:
   the frequency lock loop circuit including,
      a voltage controlled oscillator source for generating signals at different selected frequencies,
      signal splitting means coupled to the oscillator source for splitting signals output thereby into a first component and a second component, the first component of the split signal representing an output signal of the frequency lock loop circuit and the second component of the split signal representing an incident signal,
      an output amplifier coupled to the signal splitting means for receiving the output signal therefrom and amplifying the output signal to provide an amplified output signal for providing an amplified output signal source of the frequency lock loop circuit,
      a loop integrating amplifier interposed between the signal splitting means and oscillator source, the integrating amplifier generating an error signal in response to the results of a comparison between a frequency locking signal and a reference voltage, the integrating amplifier transmitting the error signal to the oscillator source for tuning the oscillator source, and
      control logic means coupled to the oscillator source for controlling tuning of the oscillator source, thereby controlling tuning of the frequency lock loop circuit; and
   the one-port tunable frequency discriminator circuit coupled to the frequency lock loop circuit for providing an improved frequency lock loop circuit having reduced phase noise and settling times, the one-port tunable frequency discriminator comprising,
      a signal detector means having an input coupled to the signal splitting means and having an output coupled to the oscillator source, via the integrating amplifier, and
      an open ended delay line coupled to the signal detector means, the signal detector means detecting the incident signal generated by the oscillator source and transmitted by the splitting means, the signal detector means transmitting the incident signal along the delay line, so that upon reaching an end of the delay line, the incident signal is reflected back along the delay line to the signal detector means creating a reflected incident signal, such that the reflected incident signal interferes with the incident signal to form a standing wave signal, the standing wave signal containing undesired spectral sideband noise energy signal components, the signal detector means converting the standing wave signal to a frequency locking signal having a voltage level proportional to the magnitude of the standing wave signal, the signal detector means transmitting the frequency locking signal to the oscillator source for locking the oscillator source at a specific frequency and for reducing phase noise energy in the output signals generated by the oscillator source, and
      phase tuning means for tuning the phase of the standing wave signal at the specific frequency for reducing the phase noise in output signals generated by the frequency lock loop circuit, the phase tuning means varying the phase of the standing wave signal at the specific frequency for enabling output signals generated by the oscillator source to be tuned in phase and frequency for enabling tuning of the oscillator source by the one-port tunable frequency discriminator circuit for providing a frequency lock loop circuit that generates output signals having reduced phase noise and for providing a frequency lock loop circuit having reduced post tuning drift.

9. The one-port tunable frequency discriminator circuit of claim 8 wherein the phase tuning means comprises a tuning varactor diode coupled to an open end of the delay line, the tuning varactor diode being selectively varied in capacitance for selectively varying the phase of the standing wave signal for causing the standing wave signal to tune in delay time, the tuning varactor diode affording frequency tuning of the one-port tunable frequency discriminator circuit for tuning the oscillator source and for reducing phase noise in output signals generated by the oscillator source the tuning varactor diode adjusting the phase of the standing wave signal across a frequency tuning range of the signal required by the frequency lock loop circuit.

10. The one-port tunable frequency discriminator circuit of claim 9 further comprising:
    means for enabling the tuning varactor diode to adjust the phase of the standing wave signal 360 degrees at the specific frequency generated by the frequency lock loop for providing a complete 360 degrees of frequency tuning range required by the frequency lock loop circuit, the means comprising,
       the control logic means transmitting a reference voltage to the loop integrating amplifier, the reference voltage adjusted about a midpoint thereof by the control logic means for increasing the phase adjusting range of the tuning varactor diode; and
       phase sense switch means interposed between the logic control means and integrating amplifier for receiving the reference voltage transmitted by the control logic means, the switch means actuated for shifting the phase sense of signals output by the integrating amplifier to obtain a remaining portion of the complete 360 degrees of frequency tuning range required by the frequency lock loop.

11. The one-port tunable frequency discriminator circuit of claim 10 wherein adjusting the reference voltage with the control logic means about the midpoint of the reference voltage provides approximately 40 degrees of phase shift for increasing the phase range of the phase adjusting means to approximately 180 degrees.

12. The one-port tenable frequency discriminator circuit of claim 10 wherein the phase sense switch means shifts the phase sense of signals output by the integrating amplifier approximately 180 degrees to obtain a remaining portion of the complete 360 degrees of frequency tuning range required by the frequency lock loop.

13. The one-port tunable frequency discriminator circuit of claim 8 further comprising:
    a low pass filter interposed between the oscillator source and the signal detector means, the low pass filter reducing harmonics in radio frequency noise in the second component of the split signal split by the signal spitting means, the filter reducing the harmonics in the second component of the split signal for preventing distortion of the desired standing wave signal.

14. The one-port tunable frequency discriminator circuit of claim 13 further comprising:

a buffer amplifier interposed between the signal splitting means and filter, the buffer amplifier configured as a balanced amplifier for insuring a match between to the low pass filter and 1-port frequency discriminator circuit for reducing triple transit reflections to a minimum, to prevent the creation of a third interference signal at the signal detector means to further prevent distortion of the standing wave signal produced by interference on the delay line.

15. The one-port tunable frequency discriminator circuit of claim 8 wherein the discriminator circuit has a bandwidth of approximately 7 MHz, the bandwidth provided by the discriminator circuit aiding reduction of the phase noise of signals generated by the oscillator source, the frequency discriminator circuit reducing phase noise by approximately 30 dB at 10 kHz and by approximately 20 dB at 100 kHz, the phase tuning means reducing post tuning drift of the frequency lock loop to less than 10 kHz over a time period ranging from approximately 1 microsecond to approximately 30 seconds.

16. The one-port tunable frequency discriminator circuit of claim 4 further comprising:

a phase lock loop circuit coupled to the frequency lock circuit for providing phase and frequency coherency of output signals generated thereby.

* * * * *